United States Patent [19]

Hovel et al.

[11] 4,379,005
[45] Apr. 5, 1983

[54] SEMICONDUCTOR DEVICE FABRICATION

[75] Inventors: Harold J. Hovel, Katonah; Jerry M. Woodall, Bedford Hills, both of N.Y.

[73] Assignee: International Business Machines Corporation, Armonk, N.Y.

[21] Appl. No.: 348,526

[22] Filed: Feb. 12, 1982

Related U.S. Application Data

[62] Division of Ser. No. 88,718, Oct. 26, 1979, abandoned.

[51] Int. Cl.[3] .................................... H01L 21/24
[52] U.S. Cl. ............................... 148/187; 29/571; 29/580; 29/591; 148/178
[58] Field of Search ................ 29/571, 591, 580; 357/16; 148/178, 187

[56] References Cited

U.S. PATENT DOCUMENTS

| | | | |
|---|---|---|---|
| 3,562,606 | 2/1971 | Heer et al. | 29/578 X |
| 3,612,958 | 10/1971 | Saito et al. | 148/175 X |
| 3,675,313 | 7/1972 | Driver et al. | 29/571 |
| 3,678,573 | 7/1972 | Driver | 29/571 |
| 3,767,482 | 10/1973 | Kock et al. | 148/178 X |
| 3,886,580 | 5/1975 | Calviello | 357/15 |
| 3,896,473 | 7/1975 | DiLorenzo et al. | 357/15 |
| 3,904,449 | 9/1975 | DiLorenzo et al. | 148/175 |
| 3,912,546 | 10/1975 | Hunsperger et al. | 148/15 |
| 3,914,784 | 10/1975 | Hunsperger et al. | 357/61 |
| 3,986,192 | 10/1976 | DiLorenzo et al. | 357/13 |
| 4,048,712 | 9/1977 | Buiatti | 29/571 |
| 4,075,652 | 2/1978 | Umebachi et al. | 357/22 |
| 4,122,476 | 10/1978 | Hovel et al. | 357/16 |
| 4,160,984 | 7/1979 | Ladd et al. | 357/22 |
| 4,173,063 | 11/1979 | Kniepkamp et al. | 29/571 |
| 4,236,166 | 11/1980 | Cho et al. | 357/22 |
| 4,255,755 | 3/1981 | Itoh et al. | 357/16 |
| 4,313,971 | 2/1982 | Wheatley | 29/591 |

OTHER PUBLICATIONS

Dumke et al., *IBM Technical Disclosure Bulletin*, vol. 14, No. 4, Sep. 1971, pp. 1248 and 1249.
Ladd et al., *Solid-State Electronics*, vol. 13, Pergamon Press, 1970, Gt. Britain, pp. 485–489.

*Primary Examiner*—G. Ozaki
*Attorney, Agent, or Firm*—Alvin J. Riddles

[57] ABSTRACT

Semiconductor devices can be fabricated using as an intermediate manufacturing structure a substrate of one semiconductor with a thin epitaxial surface layer of a different semiconductor with properties such that the semiconductors each have different solubilities with respect to a metal. When a vertical differentiation is used to expose the different materials and the metal is deposited on both and heated, the metal will form a Schottky barrier in one material and an ohmic contact in the other. Where the substrate is gallium arsenide and the epitaxial layer is gallium aluminum arsenide and the metal is tin, a self-aligned gallium arsenide MESFET is formed wherein the tin forms ohmic contacts with the gallium arsenide and a Schottky barrier contact with the gallium aluminum arsenide.

4 Claims, 3 Drawing Figures

STEP 1

STEP 2

STEP 3

STEP 1

STEP 2

STEP 3

SEMICONDUCTOR DEVICE FABRICATION

This is a division, of application Ser. No. 088,718 filed Oct. 26, 1979, now abandoned.

DESCRIPTION

1. Technical Field

The technical field of the invention is that of semiconductor devices. In such devices the small device dimensions and the precision with which those dimensions must be held are reaching the point where the physical properties of the materials and processes involved must be used to achieve the required spacing. Dimensions of less than a micron are the order of magnitude of the areas and distances at the present state of the art.

One structure requiring small dimensions is the gallium arsenide metal semiconductor field effect transistor (MESFET) which, while it can be constructed dimensionally small enough to exhibit low power and low signal delays, has a number of limitations that result from the tiny dimensions and the materials involved that make device manufacturing difficult. An example is the fact that unwanted impurities may outdiffuse from the semi-insulating substrate into the active region where they can interfere with the channel of the FET. To overcome this a buffer layer of GaAs material is often grown in the semi-insulating substrate followed by growth of the active layer. Another example is the Schottky barrier height between the gate metal and GaAs which is around 0.9 eV; this low value results in significant leakage current between gate and drain. A third example is the gate width, which is desired to be a micron or less in dimension but is difficult to produce, requiring "self-alignment" fabrication procedures.

A desirable goal would be to have a technique of fabrication in which the properties of the various materials and processes involved operate together to achieve the goals desired in the ultimate structure.

2. Background Art

There has been an approach in the art to provide different device elements in a single process step by taking a substrate and vertically differentiating certain device electrodes from others and then forming one electrode by selective removal of part of the top layer of material. This is shown in U.S. Pat. No. 4,075,652. This patent also describes one type of "self-alignment" procedure. The technique of the patent, however, still requires removing material to a precise dimension.

DISCLOSURE OF THE INVENTION

The invention involves the fabrication of semiconductor devices by providing as an intermediate manufacturing structure a substrate of one semiconductor material on which there is a thin epitaxial layer of another semiconductor material, both materials having a different solubility in a particular metal. The structure can be formed so that there is a vertical differentiation of areas to serve as parts of the device being fabricated. This is done by removing the thin epitaxial layer in selected areas. When the metal is placed in contact with the substrate in some areas, and with the remaining epitaxial layer area and subjected to a heat treatment, the difference in solubility results in the formation of Schottky barrier rectifiers in some areas and ohmic contacts in others.

Figure 1:
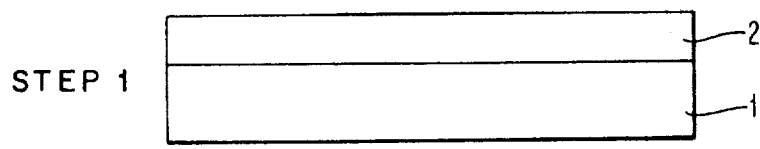
FIG. 1 is a schematic of a general process of the steps of the invention.
Figure 1:
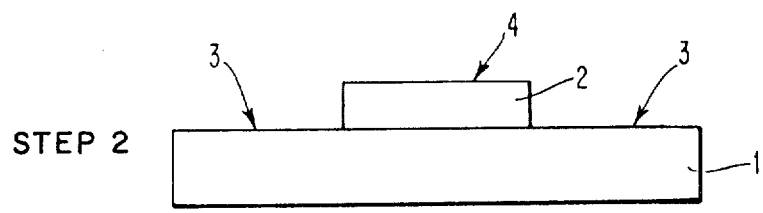
Figure 1:
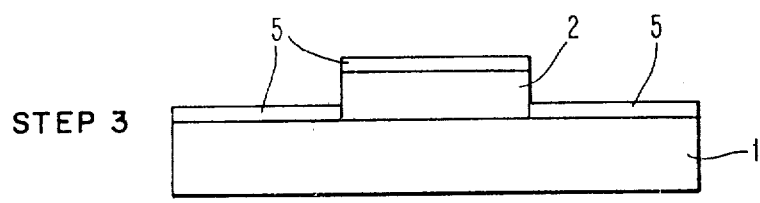

This may be seen in connection with FIG. 1 wherein in step 1 a semiconductor substrate 1 of an appropriately doped semiconductor material is provided with a thin epitaxial layer 2 of a different semiconductor material. Two materials are selected such that a metal will have a different solubility in region 1 than it will have in region 2.

Referring to step 2, a vertical differentiation is now provided to delineate areas where the difference in solubility is to be employed. This is done, for example, by etching away the portion of the region 2 leaving exposed, regions 3 of the substrate and region 4 of the epitaxial layer 2.

Referring to step 3, a metal 5 is then deposited on the regions 3 and 4. The metal 5, when fused, will alloy with the substrate 1 and form an ohmic contact and it will not alloy and hence form a Schottky barrier type rectifying contact on the region 4. The resulting structure in a single temperature step is a field effect transistor structure wherein the two ohmic contacts serve as the source and the drain contacts and the Schottky barrier contact serves as the gate contact.

While the technique of the invention has been illustrated in connection with the construction of an FET transistor, the concept of providing a substrate as an intermediate manufacturing structure made up of a substrate of a first semiconductor with a thin epitaxial layer of a different semiconductor material, the two semiconductors being such that a metal will have different solubility in each and then providing a vertical differentiation such that the metal can be positioned to either form an ohmic contact or a p-n junction or a Schottky barrier in a single temperature cycle can be applied to a variety of semiconductor device structures.

BEST MODE FOR CARRYING OUT THE INVENTION

The invention is particularly advantageous with respect to a gallium arsenide substrate having a thin epitaxial layer of gallium aluminum arsenide thereover. Such a structure when processed in accordance with the teachings of the invention, will result in a high gate barrier FET transistor.

Figure 2:
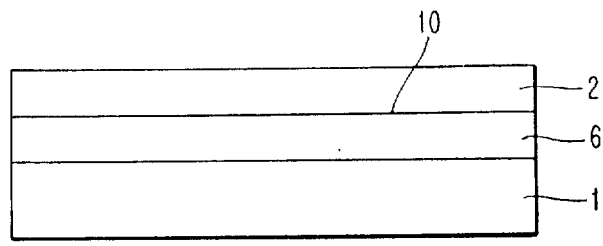
FIG. 2 is a more detailed process using the materials gallium arsenide and gallium aluminum arsenide.
Figure 2:
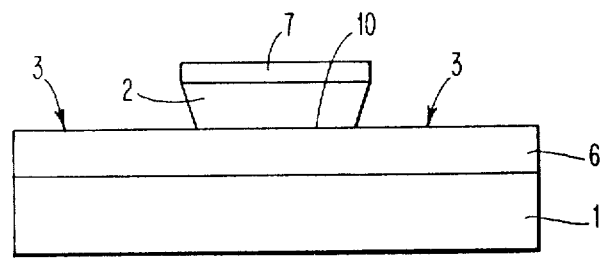
Figure 2:
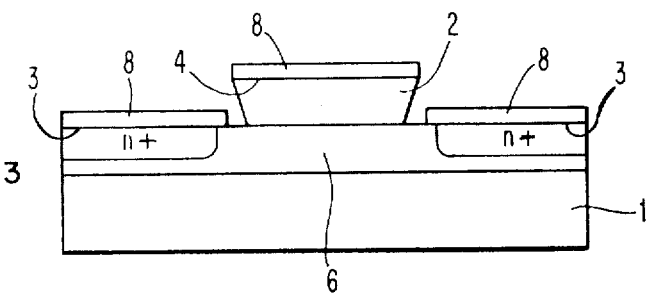

Referring to FIG. 2 in step 1 a semi-insulating gallium arsenide substrate 1 doped with chromium is provided with an epitaxial layer of gallium aluminum arsenide 2 and an active GaAs, layer 6.

As an example of one way to produce this structure, the substrate 1 is soaked in an isothermal two-phase equilibrium liquid phase epitaxy melt for 15 to 30 minutes. The melt contains a conductivity type determining element such as tin, sulfur, tellurium, or another common donor element. Liquid phase epitaxy is used to produce the gallium aluminum arsenide layer 2, and during this epitaxial growth unwanted impurities are gettered into the melt from the upper region of the chromium doped gallium arsenide and simultaneously the donor dopant element will diffuse into the substrate 1 of gallium arsenide and produce the active channel layer 6. If a technique such as etch back epitaxy is used as described in U.S. Pat. No. 4,122,476, then the epitaxial layer 2 will be graded in composition and in energy band-gap.

Figure 3:
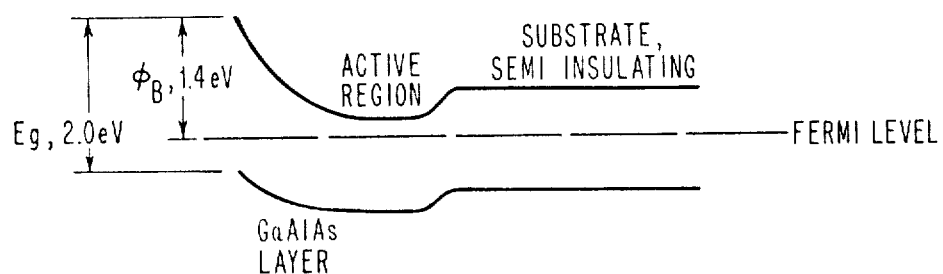
FIG. 3 is a band energy diagram illustrating the results of the various solubilities and of heat treatment.

The structure illustrated in FIG. 2 in step 1 may be more clearly perceived by referring simultaneously to FIG. 3.

Referring to both FIGS. 2 and 3, as a result of the epitaxial growth, there is a 500-1000 Å gallium aluminum arsenide layer 2 which, as may be seen from FIG. 3, is graded and has a band-gap of approximately 2.0 eV. When a Schottky barrier is made to this layer 2 a barrier height of 1.4 eV is obtained which greatly reduces the gate-drain current. A graded composition layer is more desirable than a uniform composition one of 2.0 eV band-gap because there will not be any interface states at the interface 10 between the two semiconductor materials if the composition grading is present. The diffused GaAs region 6 is about 0.3 microns thick and has about $10^{17}$ impurities/cc.

The region 6 shown in FIG. 2 and described above can be a diffused region in which the dopant has moved into the GaAs in accordance with the diffusion coefficient. However, as an alternative the active region may be produced in the first fraction of the graded epitaxial layer 2, since this fraction is almost pure gallium arsenide, or as still another alternative, the doped gallium arsenide layer 6 may be epitaxially grown before the gallium aluminum arsenide layer 2 is grown.

Referring next to step 2 of FIG. 2. A photoresist 7 is applied over a portion of the gallium aluminum arsenide region 2 and the gallium aluminum arsenide region is then selectively etched away with HCl acid exposing the regions 3 thus providing a vertical differentiation such that an area of one semiconductor material having one type of solubility behavior with respect to a metal is exposed along with an area of a semiconductor material having a different solubility behavior with respect to the same metal.

Referring now to step 3 of FIG. 2. A layer 8 of metal such as tin is provided on the region 3 and over the region 4 which has been exposed when the photoresist 7 is removed. The metal layer 8 may be made up of tin with a layer of tungsten on top. The structure is now heated to 400°-600° C. at which point the tin will dissolve some gallium arsenide but will not significantly dissolve gallium aluminum arsenide. When the structure is then cooled down, the resulting occurrence is that $2 \times 10^{18}$ doping in the gallium arsenide will occur in an epitaxial layer that grows from the dissolved tin-gallium arsenide melt. The tungsten keeps the tin in layer form and prevents it from balling up during the liquid phase epitaxial growth. The metal layer 8 forms ohmic contacts on the heavily doped regions 3.

On the surface 4, however, the tin does not significantly dissolve the gallium aluminum arsenide but rather it remains inert and forms a Schottky barrier contact.

The resulting structure is a particularly advantageous gallium arsenide metal semiconductor FET structure (MESFET). The structure has a number of advantages. The excess impurities have been gettered during the processing operation. There is a simultaneous formation of the Schottky barrier with the ohmic contacts. The gate and source-drain regions are self-aligned. The same metallurgy is employed for all contacts and a high barrier height of 1.4 eV is provided for the gate of the FET.

What has been described is a technique of providing as an intermediate manufacturing structure a substrate of a first semiconductor material having a thin epitaxial layer of a different semiconductor material, both materials exhibiting a different solubility with respect to a metal, so that by providing a vertical differentiation of device areas, p-n junctions or Schottky barriers, and ohmic contacts may be simultaneously made in one temperature cycling step.

Having described the invention, what is claimed as new and what is desired to secure by Letters Patent is:

1. The process of fabrication of semiconductor structures by the steps of providing a semiconductor body having at least two layers;
    an exposed first layer having a different solubility in a particular metal than a second underlying layer;
    providing a vertical differentiation of semiconductor device elements by selective removal of portions of said first layer thereby exposing regions of said second layer;
    applying said particular metal to said regions of said second layer and to the remaining portions of said first layer and fusing said metal and the underlying semiconductor material.

2. The process of claim 1 wherein said first layer is gallium aluminum arsenide and said second layer is gallium arsenide.

3. The process of claim 2 wherein said metal is tin.

4. In the fabrication of semiconductor devices by forming device elements in different areas of a semiconductor substrate by employing a vertical differentiation of areas of said substrate, the improvement comprising:
    providing the substrate with layers of different semiconductor materials each capable of producing a different device element or fusion with a specific metal;
    exposing areas of the layers of the different semiconductor materials to provide the device regions; and
    fusing said specific metal into each exposed regions.

* * * * *